United States Patent
Williams

(10) Patent No.: US 10,921,363 B2
(45) Date of Patent: Feb. 16, 2021

(54) SYSTEMS AND METHODS FOR BREAK DETECTION

(71) Applicant: CABLE TELEVISION LABORATORIES, INC, Louisville, CO (US)

(72) Inventor: Thomas Holtzman Williams, Longmont, CO (US)

(73) Assignee: Cable Television Laboratories, Inc., Louisville, CO (US)

(*) Notice: Subject to any disclaimer, the term of this patent is extended or adjusted under 35 U.S.C. 154(b) by 22 days.

(21) Appl. No.: 16/155,866

(22) Filed: Oct. 9, 2018

(65) Prior Publication Data
US 2019/0107572 A1   Apr. 11, 2019

Related U.S. Application Data

(60) Provisional application No. 62/569,645, filed on Oct. 9, 2017.

(51) Int. Cl.
  *G01R 31/08* (2020.01)
  *B64C 39/02* (2006.01)
  *H04B 3/462* (2015.01)

(52) U.S. Cl.
  CPC .......... *G01R 31/085* (2013.01); *B64C 39/024* (2013.01); *H04B 3/462* (2013.01); *B64C 2201/12* (2013.01)

(58) Field of Classification Search
  CPC ........ G01R 31/11; G01R 31/50; G01R 31/52; G01R 31/58; H04B 3/46; H04B 3/462; H04B 3/466; B64C 39/024; B64C 2201/12
  See application file for complete search history.

(56) References Cited

U.S. PATENT DOCUMENTS

| | | | |
|---|---|---|---|
| 2005/0125117 A1* | 6/2005 | Breed | G07C 5/008 701/31.5 |
| 2010/0026310 A1* | 2/2010 | Shimp | G01R 29/0828 324/527 |
| 2012/0250010 A1* | 10/2012 | Hannay | G01N 21/952 356/237.1 |
| 2016/0197804 A1* | 7/2016 | Zinevich | H04L 43/08 370/252 |
| 2017/0272184 A1* | 9/2017 | Zinevich | H04B 17/345 |
| 2018/0109767 A1* | 4/2018 | Li | H04N 5/23206 |

* cited by examiner

*Primary Examiner* — Son T Le
*Assistant Examiner* — Dustin R Dickinson
(74) *Attorney, Agent, or Firm* — Armstrong Teasdale LLP

(57) ABSTRACT

A system for detecting a failure along a transmission line of a cable plant is provided. The system includes a mobile vehicle configured to travel along a pathway substantially proximate to the cable plant along a span of the transmission line, and a transmitter disposed with the mobile vehicle. The transmitter is configured to emit (i) a test signal capable of ingressing the transmission line at a location of the failure, and (ii) an information signal containing location and velocity data of the mobile vehicle. The test signal is configured to provide phase shift and Doppler frequency information to a receiver operably connected to the transmission line at a location upstream from the location of the failure.

19 Claims, 1 Drawing Sheet

SYSTEMS AND METHODS FOR BREAK DETECTION

CROSS REFERENCE TO RELATED APPLICATIONS

This application claims the benefit of and priority to U.S. Provisional Patent Application Ser. No. 62/569,645, filed Oct. 9, 2017, the disclosure of which is herein incorporated by reference in its entirety.

BACKGROUND

The field of the disclosure relates generally to data transmission systems, and more particularly, to data transmission systems utilizing defect testing on data transmission lines.

Conventional transmission systems cable operators experience a problem with aging cable lines that, over time, experience a variety of faults. A shield break in the cable line, for example, is a fault producing a discrete reflection from one point in the line. Other faults, such as water seeping into the cable, will increase signal attenuation through the cable, even if the seepage only sometimes produces reflections. In an outdoor environment, the cable line is typically copper or fiber, and may be planted (i.e., a cable plant) as aerial cable between poles, in an underground conduit system, or by direct burial. However, whether aerial or buried, cable shields and splices eventually fail due to environmental conditions, causing degraded subscriber quality of experience or signal outage.

When a cable plant experiences transmission difficulties, the questionable cable line must be assessed for the line quality. That is, the line must be checked for faults due to problems such as shield breaks, water damage, stress fractures, corrosion, bad connectors, failed splices, animal chews, or other mechanical damage. The failing/failed line may exhibit excessive attenuation, reflections, or both. The line will typically also be checked to determine if there has been an attempt to cut into the line for signal sharing, such as from an illegal tap. Conventional testing schemes typically perform a "truck roll" to locate the source of the failure, and then replace the failed portion of the cable. In a truck roll, a moving vehicle travels along the cable plant to measure the signal proximate the cable, and attempt to capture the leakage from the source of the failure.

Cable operators have long used truck rolls to detect signal leakage in lower frequency bands. For example, in systems using amplifier cascades with diplex filters, only signals within the 5-42 MHz range are able to travel back to the fiber node. However, more recently, many cable plants have been experiencing significant signal leakage in the UHF spectrum (e.g., typically between 300 MHz and 3 GHz), which may interfere with CATV services, as well as other services, such as long term evolution (LTE) communications. The long wavelengths of the lower frequencies, which conventional truck roll techniques measure, are not generally useful for accurate leakage location at these higher UHF frequencies. Additionally, a conventional truck roll requires use of measuring equipment having substantial weight, and which may not easily be carried by a human technician, or mounted on an aerial surveillance vehicle (e.g., a drone).

BRIEF SUMMARY

In an embodiment, a system for detecting a failure along a transmission line of a cable plant is provided. The system includes a mobile vehicle configured to travel along a pathway substantially proximate to the cable plant along a span of the transmission line, and a transmitter disposed with the mobile vehicle. The transmitter is configured to emit (i) a test signal capable of ingressing the transmission line at a location of the failure, and (ii) an information signal containing location and velocity data of the mobile vehicle. The test signal is configured to provide phase shift and Doppler frequency information to a receiver operably connected to the transmission line at a location upstream from the location of the failure.

In an embodiment, method is provided for detecting a shield break along a cable line by a mobile vehicle. The method includes a step of traveling along a span of the transmission line at a first velocity within a detectable proximity to the transmission line. The method further includes a step of transmitting, during the step of traveling, (i) a test signal capable of entry into the transmission line at the shield break, and (ii) a periodic information signal containing updated location and velocity information about the mobile vehicle. The method further includes a step of receiving, through the transmission line from the shield break, the test signal. The method further includes a step of analyzing the received test signal together with the updated location and velocity information from the information signal to determine a Doppler frequency spectrum of the mobile vehicle with respect to the transmission line.

BRIEF DESCRIPTION OF THE DRAWINGS

These and other features, aspects, and advantages of the present disclosure will become better understood when the following detailed description is read with reference to the following accompanying drawings, in which like characters represent like parts throughout the drawings.

Figure 1:
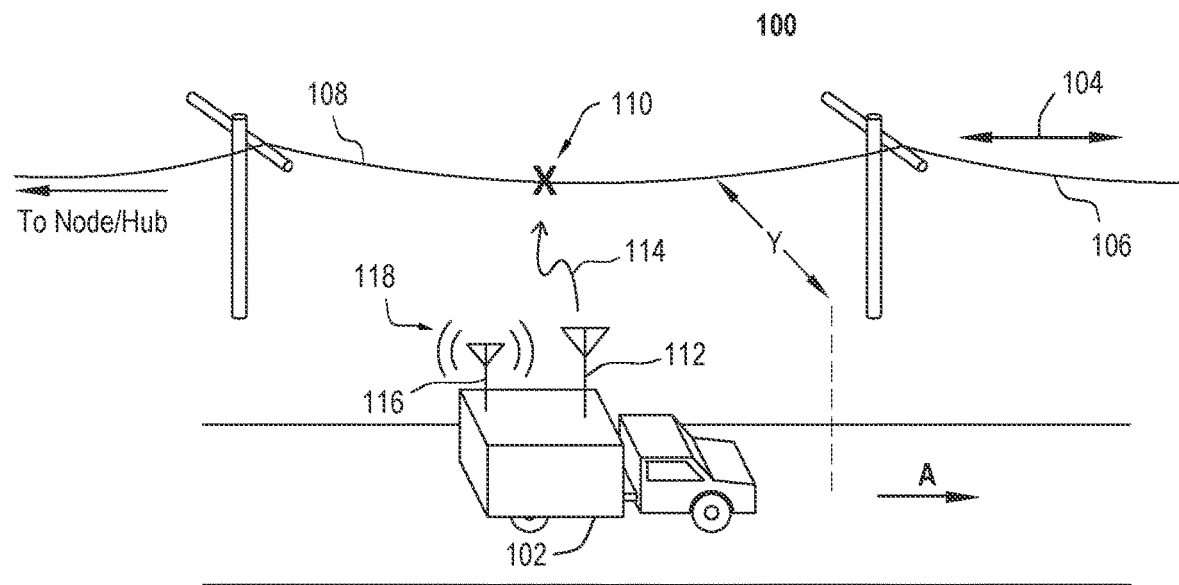
FIG. 1 is a graphical illustration depicting a break detection system in accordance with an embodiment.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

FIG. 1 is a graphical illustration depicting a break detection system 100. System 100 includes at least one mobile detection vehicle 102. In the exemplary embodiment illustrated in FIG. 1, mobile detection vehicle is depicted as a land-based automobile (e.g., a truck) configured to perform a truck roll. This example is provided for ease of explanation, but is not intended to be limiting. As described further herein, in some embodiments, mobile detection vehicle 102 may be aerial-based (e.g., a plane, drone, etc.). In other embodiments, mobile detection vehicle 102 may represent an electronic device being carried by a person at walking speeds.

In this example, vehicle 102 is further depicted to travel along a direction A that substantially follows a pathway 104 of a cable plant 106, at a substantially perpendicular separation distance Y from cable plant 106. In this example, cable plant 106 is depicted as an outdoor aerial plant, but may also be a buried plant, an indoor plant, or another known cable line distribution. Cable plant 106 includes at least one cable line 108 in operable communication with (e.g., physically connected to) at least one node or hub site (not shown in FIG. 1). Cable line 108 may, for example, be a coaxial cable, a twisted-pair line, or a communication fiber. Cable line 108 includes a shield break 110 along pathway 104.

In the exemplary embodiment, vehicle 102 includes a first transmitter 112 configured to emit a continuous wave (CW) radio frequency (RF) test signal 114. Vehicle 102 may further include a second transmitter 116 configured to emit an RF informational signal 118. RF informational signal 118 may, for example, include information pertaining to the latitude, longitude, velocity, and direction of vehicle 102 at any given moment in time. In an exemplary embodiment, RF information signal is transmitted continually, at frequent periodic intervals (e.g., 10-100 times/second). In the example depicted in FIG. 1, first and second transmitters 112, 114 are shown to be separate and distinct elements. In at least one embodiment, first and second transmitters 112, 114 are the same element, which is configured to transmit both test signal 114 and informational signal 118. In some embodiments, vehicle latitude and longitude, as well as vehicle velocity, may be obtained from a GPS device (not separately shown) disposed in or on vehicle 102.

In exemplary operation of system 100, vehicle 102 travels in direction A substantially along pathway 104 and emits RF a CW test signal 112 within a detectable vicinity of cable line 108. As vehicle approaches the physical location of shield break 110, test signal 112 is picked up by shield break 110 and will travel upstream of cable line 108 (i.e., with respect to a downstream transmission from the cable operator) toward the node/hub (e.g., a fiber node, a modem termination system (MTS) or cable MTS (CMTS), an optical line terminal (OLT), etc.). A receiver (not shown in FIG. 1) at, or in operable communication with, the node/hub may then analyze the frequency spectrum of test signal 112 over time for phase shift information and Doppler frequency information over time. An exemplary frequency plot is illustrated below with respect to FIG. 2.

Figure 2:
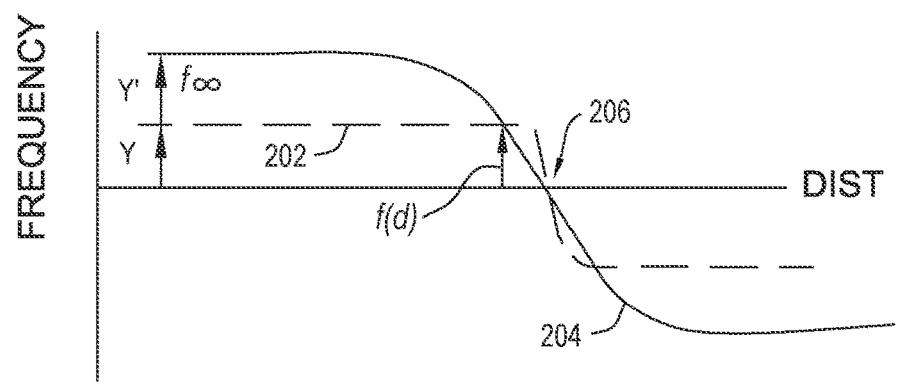
FIG. 2 is a graphical illustration depicting a frequency distribution that may be received according to operation of the break detection system depicted in FIG. 1.

FIG. 2 is a graphical illustration depicting a frequency distribution 200 that may be received according to operation of break detection system 100, FIG. 1. In the exemplary embodiments depicted in FIG. 2, distribution 200 is illustrated with respect to a first frequency plot 202 and a second frequency plot 204, with both first and second frequency plots 202, 204 represented as a function of distance of travel by vehicle 102 in direction A. In the exemplary embodiment, first frequency plot 202 indicates a case of vehicle 102 travels at a relatively constant separation distance Y from pathway 104, and second frequency plot 204 indicates a case of vehicle 102 traveling at a significantly greater separation distance Y' from pathway 104.

Further to the example depicted in FIG. 2, first frequency plot 202 is illustrated to shift more abruptly and precipitously about a point 206 corresponding to break location 110, whereas second frequency plot 204 is illustrated to flow more smoothly about the same point 206. These different curve shapes may occur, for example, in the case where vehicle 102 is traveling at relatively high speeds (e.g., smooth curve of second frequency plot 204), and at relatively slower speeds (e.g., sharper curve of first frequency plot 202). For ease of explanation, plot 202, 204 illustrated cases of vehicle 102 traveling at substantially constant velocities and separation distances Y from cable plant 106. In actual practice, the velocity of vehicle 102, as well as its separation distance Y from cable plant 106, are expected to vary over a truck roll operation.

Accordingly, in the exemplary embodiment, vehicle 102 travels substantially along pathway 104 and emits RF CW test signal 112, which is picked up by cable line 108 at shield break 110, and travels upstream toward the node (or hub) where test signal 112 is received and analyzed for phase shift and Doppler frequency over time and distance. In the exemplary embodiment, vehicle 102 further admits RF information signal 118 indicating the latitude, longitude, velocity, and/or direction A of vehicle 102 at the time of broadcast (e.g., 10-100 times/sec). At the receiver, test signal 112 and information signal 118 are received and analyzed for the source location and the point of Doppler shift, as indicated in FIG. 2.

In some embodiments, the emission and coordinated analysis of signals 112, 118 at the receiver are similar in some respects to synthetic aperture radar (SAR) and inverse SAR (ISAR) techniques, but may be performed in a significantly simplified and advantageous manner. That is, SAR/ISAR are techniques, typically employed in high-speed aircraft and space-based probes and satellites, using radar imaging to generate high resolution images of a target. ISAR technology utilizes the movement of the target to create a synthetic aperture, whereas SAR utilizes the movement of the emitter, somewhat in the matter of the present embodiments. SAR systems, however, employ beamforming to aim a signal in a direction perpendicular to the path of system travel. In contrast, the present embodiments do not require beamforming for emission of either signal 112, 118.

The innovative techniques of the present embodiments are therefore of particular advantage use with respect to newer fiber deep and N+0 architectures, where UHF signals may propagate back to the fiber node/hub site. As described above, systems using amplifier cascades with diplex filters only permits signals in the 5-42 MHz range to travel back to fiber node, and these longer wavelengths are therefore not useful for accurate leakage location as UHF frequencies.

In the exemplary embodiments illustrated herein, processing of signals 112, 118 are described as being processed at the node or hub site. However, the person of ordinary skill in the art will understand, after reading and comprehending the present description and drawings, that signal reception, processing, and analysis are not limited to these locations only. For example, reception and/or processing may be performed by a processor (not shown) installed within vehicle 102 (e.g., a separate processing unit programmed with executable instructions, a handheld device with adequate processing power, etc.).

Furthermore, signals 112, 118 may be transmitted from separate transmitters or antennas, or may be transmitted from the same transmitter or antenna. In some embodiments, either or both of signals 112, 118 may be transmitted from more than one antenna/transmitter where some redundancy may be desired.

In an exemplary embodiment, system 100 is configured to transmit information signal 118 substantially in real-time. In other embodiments, vehicle 102 may be configured to include at least one memory unit/device (not shown) capable of storing precision timestamps of the continual latitude/longitude data of vehicle 102, which then may be downloaded at the receiver and matched with data of test signal 112, which may arrive separately.

The present systems and methods are described herein with respect to CW RF signals, but these signals are also provided by way of example, and are not intended to be limiting. Other types of signals may be used, such as those capable of being analyzed for phase information (e.g., CW chirps, pseudo-noise (PN) sequences, etc.). In some embodiments, test signal 112 is transmitted at a single frequency. In other embodiments, test signal 112 is transmitted as a plurality of signals and/or at multiple frequencies at a time (e.g., 139 MHz, 400 MHz and 800 MHz).

The present systems and methods are particularly advantageous with respect to the mode of application as well. That is, the present embodiments represent a significant improvement to a conventional truck roll technique on a cable plant, with respect to both the efficiency and accuracy of the truck roll. Nevertheless, the techniques described herein are also significantly advantageous for use by, for example, a technician on foot testing an individual house or building, as well as an individual span of a cable line. In at least one embodiment, the technician is able to employ the present embodiments at a plant location while on foot, and receive a leakage report from the headend/hub on a handheld mobile device (e.g., smart phone). The present techniques therefore useful in not only coaxial cable embodiments, but also for systems employing twisted-pair transmission lines, or other non-coaxial transmission media, and for both indoor and outdoor plants.

The present systems and methods therefore represent significant advances over conventional techniques. Conventional leak detection systems, for example, may not be easily configured to operate two separate antennas from the detection vehicle, due to the risk of creating a false image. The present embodiments, on the other hand, are able to avoid this problem by employing further techniques and/or algorithms such as antenna travel deviation from straight-line, and/or inverse fast Fourier transform (IFFT).

According to the present systems and methods, a variety of different detection system architectures may be employed for various types of detection vehicle. For example, whereas conventional truck rolls are performed using a land-based automobile, the present embodiments may be easily configured to operate on aerial vehicles, such as drones. Whereas a land-based automobile is difficult to keep at a constant velocity over an entire cable span of a truck roll, modern drones are capable of traveling at a relatively constant speed without interruption. Additionally, as the distance between a cable plant and a road may vary substantially over the span of a truck roll, a drone may be more easily controls to maintain a substantially constant perpendicular distance from the cable plant, and without significant interruption (e.g., stopping at traffic devices, slowing from the presence of other vehicles on the road, etc.).

Furthermore, implementation of the present embodiments with respect to an aerial drone may further provide greater flexibility with respect to the system hardware architecture. Drones tend to be more significantly limited to the amount of weight that can be carried during operation. In many conventional systems though, receivers tend to be heavier (and more expensive) than most transmitters. Accordingly, an aerial drone may be advantageously equipped with a single transmitter, or few lightweight transmitters, and the receiver may be disposed at the node or hub, or other remote location (e.g., servicing multiple transmitters). That is, the drone need only be equipped with a transmitter (or transmitters) sufficiently capable of transmitting test signal 112 and information signal 118, but would not require any receiving capability beyond that needed to operate the drone. Some such drones may be programmed to execute the present embodiments following a cable plant pathway programmed into an autopilot of the drone, and such drones might not need any receiver ability to operate.

Systems and methods according to the present embodiments thus represent significant improvements conventional shield break and leakage detection schemes. Exemplary embodiments of systems and methods for break detection are described above in detail. The systems and methods of this disclosure though, are not limited to only the specific embodiments described herein, but rather, the components and/or steps of their implementation may be utilized independently and separately from other components and/or steps described herein.

Although specific features of various embodiments may be shown in some drawings and not in others, such is for convenience only. In accordance with the principles of the systems and methods described herein, any feature of a drawing may be referenced or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a programmable logic unit (PLU), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for detecting a failure along a transmission line of a cable plant, comprising:

a mobile vehicle configured to travel along a pathway at a separation distance substantially perpendicular to and proximate to the cable plant along a lengthwise span of the transmission line; and a transmitter disposed with the mobile vehicle, and configured to emit (i) a continuous wave radio frequency (RF) test signal capable of ingressing the transmission line at a location of the failure, and (ii) an information signal, different from the continuous wave RF test signal, containing location and velocity data of the mobile vehicle, wherein the continuous wave RF test signal is configured to provide frequency spectrum information to a receiver operably connected to the transmission line at a location upstream from the location of the failure, whereby receipt of the continuous wave RF test signal at the receiver enables the receiver to analyze the frequency spectrum information over time for phase shift information and Doppler frequency information with respect to the separation distance from the vehicle to the cable plant.

2. The system of claim 1, wherein the transmitter comprises a first transmitter portion configured to emit the continuous wave RF test signal and a second transmitter portion configured to emit the information signal.

3. The system of claim 2, wherein the first transmitter portion comprises a first antenna, the second transmitter portion comprises a second antenna, and the first antenna is separate from the second antenna.

4. The system of claim 2, further comprising a GPS unit disposed within the mobile vehicle, wherein the information signal from the second transmitting portion includes longitude and latitude data obtained from the GPS unit.

5. The system of claim 4, wherein the longitude and latitude data is transmitted periodically from the second transmitting portion on a continual basis during operation.

6. The system of claim 5, wherein the longitude and latitude data is updated and transmitted between 10 and 100 times every second.

7. The system of claim 4, further comprising a memory unit disposed within the mobile vehicle, wherein the memory unit is configured to store the longitude and latitude data obtained from the GPS unit with timestamps associated with the respective data.

8. The system of claim 7, wherein the second transmitting portion is further configured to transmit, as download data to the receiver, the longitude and latitude data stored in the memory unit.

9. The system of claim 1, wherein the mobile vehicle comprises a land-based automobile.

10. The system of claim 1, wherein the mobile vehicle comprises a handheld electronic device.

11. The system of claim 1, wherein the mobile vehicle comprises an aerial vehicle.

12. The system of claim 11, wherein the aerial vehicle is an aerial drone.

13. The system of claim 12, wherein the aerial drone includes an autopilot module capable of being programmed with executable instructions that, when executed by a processor disposed within the aerial drone, enable the area drone to travel along the lengthwise span of the transmission line at a substantially constant aerial speed, and wherein the perpendicular separation distance between the aerial drone and the transmission line remains substantially constant over the lengthwise span.

14. The system of claim 1, wherein the test signal is emitted within the UHF frequency range.

15. The system of claim 1, wherein the continuous wave RF test signal includes at least one of a continuous wave chirp and a pseudo-noise sequence.

16. The system of claim 1, wherein the continuous wave RF test signal comprises multiple frequencies transmitted simultaneously.

17. The system of claim 1, wherein the cable plant is one of an indoor plant and an outdoor plant.

18. A method for detecting a shield break along a cable line by a mobile vehicle, the method comprising the steps of:
traveling along a span of the transmission line at a first velocity and a vehicle separation distance within a detectable proximity to the transmission line;
transmitting, during the step of traveling, (i) a continuous wave test signal capable of entry into the transmission line at the shield break, and (ii) a periodic information signal containing updated location and velocity information about the mobile vehicle, wherein the continuous wave test signal is transmitted from a first transmitter of the mobile vehicle, and wherein the periodic information signal is transmitted from a second transmitter of the mobile vehicle, different from the first transmitter;
receiving, through the transmission line from the shield break, the test signal; and
analyzing, at a remote location in communication with the transmission line upstream of the mobile vehicle, the received continuous wave test signal together with the updated location and velocity information from the periodic information signal to determine a Doppler frequency spectrum of the mobile vehicle at the first velocity with respect to the vehicle separation distance from the transmission line.

19. The method of claim 18, further comprising a step of calculating, to mitigate a risk of a false image between the first and second transmitters, at least one of an inverse Fourier transform, and (ii) an antenna travel deviation from straight-line.

* * * * *